(12) United States Patent
Ciccarelli et al.

(10) Patent No.: US 9,392,736 B2
(45) Date of Patent: Jul. 12, 2016

(54) METHODS FOR PRODUCING IMAGE SENSORS HAVING MULTI-PURPOSE ARCHITECTURES

(71) Applicant: Semiconductor Components Industries, LLC, Phoenix, AZ (US)

(72) Inventors: Antonio S. Ciccarelli, Webster, NY (US); Eric J. Meisenzahl, Ontario, NY (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 249 days.

(21) Appl. No.: 13/953,382

(22) Filed: Jul. 29, 2013

(65) Prior Publication Data

US 2013/0312248 A1 Nov. 28, 2013

Related U.S. Application Data

(63) Continuation of application No. 13/115,235, filed on May 25, 2011, now Pat. No. 8,800,130.

(51) Int. Cl.
| | |
|---|---|
| G01R 3/00 | (2006.01) |
| H05K 13/00 | (2006.01) |
| H01L 27/148 | (2006.01) |
| H04N 5/343 | (2011.01) |
| H04N 5/372 | (2011.01) |

(52) U.S. Cl.
CPC .......... *H05K 13/00* (2013.01); *H01L 27/14831* (2013.01); *H04N 5/343* (2013.01); *H04N 5/37213* (2013.01); *Y10T 29/49002* (2015.01); *Y10T 29/49007* (2015.01); *Y10T 29/49128* (2015.01); *Y10T 29/49155* (2015.01)

(58) Field of Classification Search
USPC ............... 29/592.1, 595, 831, 846; 156/73.1; 600/345, 309, 365
See application file for complete search history.

(56) References Cited

U.S. PATENT DOCUMENTS

| | | |
|---|---|---|
| 4,035,667 A | 7/1977 | Heller |
| 4,315,164 A | 2/1982 | Kub et al. |
| 4,500,915 A | 2/1985 | Koike et al. |
| 4,593,303 A | 6/1986 | Dyck et al. |
| 4,658,281 A | 4/1987 | Sevenhans et al. |
| 4,688,066 A * | 8/1987 | Elabd ........................ 257/250 |
| 4,807,037 A | 2/1989 | Iesaka et al. |
| 4,912,536 A | 3/1990 | Lou |
| 4,924,316 A | 5/1990 | Kobayashi et al. |
| 4,951,106 A | 8/1990 | Blouke |
| 4,989,075 A | 1/1991 | Ito |
| 5,077,592 A | 12/1991 | Janesick |
| 5,210,049 A | 5/1993 | Anagnostopoulos |
| 5,291,294 A | 3/1994 | Hirota |
| 5,298,777 A | 3/1994 | Lee |
| 5,308,970 A | 5/1994 | Pool |

(Continued)

FOREIGN PATENT DOCUMENTS

EP 2385696 A1 11/2011

*Primary Examiner* — Paul D Kim

(57) ABSTRACT

A charge-coupled device (CCD) image sensor includes multiple vertical charge-coupled device (VCCD) shift registers and independently-controllable gate electrodes disposed over the VCCD shift registers and arranged into physically separate and distinct sections that are non-continuous across the plurality of VCCD shift registers. The CCD image sensor can be configured to operate in two or more operating modes, including a full resolution charge multiplication mode.

10 Claims, 10 Drawing Sheets

(56) References Cited

U.S. PATENT DOCUMENTS

| | | |
|---|---|---|
| 5,337,340 A | 8/1994 | Hynecek |
| 5,537,146 A | 7/1996 | Tohyama |
| 5,760,431 A | 6/1998 | Savoye et al. |
| 5,777,670 A | 7/1998 | Sawanobori et al. |
| 5,969,759 A | 10/1999 | Morimoto |
| 6,087,685 A | 7/2000 | Harada |
| 6,288,744 B1 | 9/2001 | Takahashi et al. |
| 6,444,968 B1 | 9/2002 | Burt et al. |
| 6,693,671 B1 | 2/2004 | Stevens et al. |
| 6,784,412 B2 | 8/2004 | Hynecek |
| 7,139,023 B2 | 11/2006 | Hynecek |
| 7,235,824 B1 * | 6/2007 | Singh .......................... 257/217 |
| 7,333,146 B1 | 2/2008 | Etoh |
| 7,420,605 B2 | 9/2008 | Pool et al. |
| 7,522,205 B2 | 4/2009 | Parks |
| 8,411,189 B2 | 4/2013 | Ciccarelli et al. |
| 2003/0035057 A1 | 2/2003 | Hakamata et al. |
| 2003/0042400 A1 | 3/2003 | Hynecek |
| 2006/0055802 A1 | 3/2006 | Parks |
| 2006/0125943 A1 | 6/2006 | Parks |
| 2010/0157119 A1 | 6/2010 | Parks |
| 2011/0024606 A1 | 2/2011 | Suzuki et al. |
| 2011/0031377 A1 | 2/2011 | Suzuki et al. |
| 2012/0297617 A1 | 11/2012 | Ciccarelli et al. |
| 2012/0300108 A1 | 11/2012 | Ciccarelli et al. |

* cited by examiner

METHODS FOR PRODUCING IMAGE SENSORS HAVING MULTI-PURPOSE ARCHITECTURES

CROSS-REFERENCE TO RELATED APPLICATIONS

This patent application is a continuation of, and claims priority to and all advantages of, U.S. patent application Ser. No. 13/115,235 filed on May 25, 2011, now U.S. Pat. No. 8,800,130, which is incorporated herein by reference.

TECHNICAL FIELD

The present invention relates to image sensors for use in digital cameras and other types of image capture devices, and more particularly to Charge-Coupled Device image sensors.

BACKGROUND

Charge-Coupled Device (CCD) image sensors capture images using an array of photosensitive areas that collect charge in response to light. FIG. 1 is a simplified block diagram of a prior art CCD image sensor. Image sensor 100 includes vertical charge-coupled device (VCCD) shift registers 102 that each include a column of charge storage elements 104. For simplicity, only three VCCD shift registers are shown in FIG. 1. When an image is captured by image sensor 100, charge packets 106 in the VCCDs 102 are shifted in parallel one row at a time to charge storage elements 108 in horizontal CCD (HCCD) shift register 110. Each row of charge in HCCD 110 is shifted serially one charge storage element 108 at a time to output circuit 112. Output circuit 112 converts the charge packets into analog voltage output signal ($V_{out}$). Other components in an imaging system typically process and redisplay the pixels to reproduce the captured image.

Depending on frame rate requirements, it may be necessary to increase the speed of charge transfer from the image sensor to the rest of the imaging system. Common approaches include increasing the transfer rate of the shift registers or providing additional output structures where each output handles only a portion of the total number of pixels. A commonly found example of a prior art image sensor with multiple output structures is shown in FIG. 2. The gate electrodes (not shown) overlying the array of pixels 200 run continuously across the entire array. The clocking signals applied to the gate electrodes shift charge out of the array and into one of four different output structures 202, 204, 206, 208. This arrangement is sometimes referred to as quadrant readout architecture.

Additionally, an image sensor having the architecture shown in FIG. 2 can be constructed and driven with a flexible clocking scheme such that the pixels are readout of pixel array 200 in arrangements other than the four output quadrant mode. For example, in image sensors such as the commercially available Kodak KAI-01050 CCD image sensor, pixels can be alternatively readout into any one, two or even three output structures. This flexible readout architecture enables a camera designer to trade off frame rate by deciding how many outputs a camera will support. Using fewer outputs generally reduces camera electronics costs, simplifies image reconstruction and improves image quality.

In some situations, it is desirable to improve the sensitivity and signal-to-noise ratio of an image sensor through charge amplification or multiplication. FIG. 3 illustrates a prior art image sensor that includes an extended HCCD shift register for the purpose of amplifying the signal of a captured image. HCCD shift register 300 and charge multiplication HCCD shift register 302 both include charge storage elements that are each driven by one or more gate electrodes (not shown). Charge is shifted from HCCD shift register 300 into charge multiplication shift register 302. Charge multiplication or amplification occurs during charge transfer in charge multiplication shift register 302 through the application of large voltages to the overlying gate electrodes in the shift register 302. The resulting large electric fields within the silicon produce a signal larger than originally detected in the pixels in pixel array 304. Many factors control the amount of signal amplification including the amount of charge present, the extent of the electric field strength and the number of amplifying stages in the charge multiplication shift register 302. U.S. Pat. Nos. 4,912,536, 5,337,340, 6,444,968, 6,784,412, 7,139,023 and 7,420,605 disclose various methods and structures for charge multiplication.

One limitation to charge multiplying HCCD shift register 302 in some image sensors is be the increased die size and associated higher manufacturing costs. In addition, if the number of phases in the charge multiplying HCCD shift register 302 is not an even multiple of HCCD shift register 300, then line and frame rates are degraded as result of having to spend additional time clocking the extra HCCD phases not associated to image data.

U.S. Pat. No. 7,522,205 describes an architecture where the HCCD shift register is operated in normal fashion for full image resolution readout and alternately as a charge multiplication HCCD shift register for half image resolution readout. FIG. 4 depicts the operation of a CCD image sensor during full image resolution readout mode as disclosed in U.S. Pat. No. 7,522,205. FIG. 5 illustrates the operation of the CCD image sensor shown in FIG. 4 during the charge multiplication mode. HCCD shift register 400 can be operated to shift charge to one or two outputs in normal readout (FIG. 4) by means of independent sets of HCCD clocks, $H_A$ and $H_B$. During charge multiplication readout mode (FIG. 5), both $H_A$ and $H_B$ are operated such that charge transfer occurs in only one direction and $H_A$ clock voltages are increased to achieve the desired charge multiplication. A split fast dump row structure 500, 502 is used to independently control whether or not charge packets from the left side 504 or the right side 506 of the pixel array are allowed to transfer into HCCD shift register 400. FIG. 5 illustrates how charge packets in the columns associated with the left side 504 are prevented from dropping down into HCCD shift register 400 by the split fast dump row structure 500 so as to avoid interfering with the charge packets being readout from the previous line on the right side 506 of the pixel array. The charge multiplication mode shown in FIG. 5 can keep the frame rate constant but produces a half resolution image because half of the image is lost or thrown away through the fast dump row structure 500.

SUMMARY

According to a first aspect, a Charge-Coupled Device (CCD) image sensor is configured to operate in multiple modes of operation, including a full resolution charge multiplication mode. By way of example only, other modes of operation can include a full resolution image readout mode or a reduced resolution image readout mode.

The CCD image sensor can include a pixel array having multiple vertical charge-coupled device (VCCD) shift registers and independently-controllable gate electrodes disposed over the VCCD shift registers. The independently-controllable gate electrodes are arranged into physically separate and distinct sections that are non-continuous or disrupted across the plurality of VCCD shift registers in the pixel array. The CCD image sensor can include horizontal charge-coupled device (HCCD) shift registers each including charge storage elements. Each charge storage element can be connected to a respective VCCD shift register to receive charge directly from the respective VCCD shift register. The CCD image sensor can include one or more timing generators for producing VCCD clocking signals applied to respective independently-controllable gate electrodes for shifting charge through the VCCD shift registers and into respective HCCD shift registers. The same or different timing generators can produce HCCD clocking signals applied to respective gate electrodes for shifting charge through the HCCD shift registers. The timing generator or generators can be operable to produce VCCD and HCCD clocking signals for the full resolution charge multiplication mode as well as for other operating modes, such as a full resolution image readout mode.

The image sensor can be included in an image capture device. The timing generator or generators that are configured to produce VCCD clocking signals or HCCD clocking signals can be included in the image capture device. The image capture device can include a processor operable to control the production of VCCD or HCCD clocking signals based on the respective operating mode of the image capture device.

According to another aspect, a method for producing an image sensor configured to operate in multiple modes of operation, including a full resolution charge multiplication mode includes forming a first section of gate electrodes over a portion of VCCD shift registers and forming a second section of gate electrodes over a remaining portion of the VCCD shift registers. A physical gap is formed between the two sections of gate electrodes such that the first and second sections of gate electrodes are physically separated and electrically isolated from each other.

According to yet another aspect, a method for operating an image sensor configured to operate in multiple modes of operation, including a full resolution charge multiplication mode includes applying VCCD clocking signals to one section of gate electrodes to shift charge from the VCCD shift registers corresponding to one section of gate electrodes directly into respective charge storage elements in a first HCCD shift register. VCCD clocking signals can be applied to another section of gate electrodes to shift charge from the VCCD shift registers corresponding to the other section of gate electrodes directly into respective charge storage elements in a second HCCD shift register. The method can further include applying HCCD clocking signals to gate electrodes disposed over the first HCCD shift register to shift the charge through the HCCD shift register and into a third HCCD shift register. HCCD clocking signals can be applied to gate electrodes disposed over the third HCCD shift register to shift the charge through the third HCCD shift register and multiply the charge as the charge shifts through the third HCCD shift register. HCCD clocking signals can be applied to gate electrodes disposed over the second HCCD shift register to shift the charge through the HCCD shift register into a fourth HCCD shift register. HCCD clocking signals can be applied to gate electrodes disposed over the fourth HCCD shift register to shift the charge through the fourth HCCD shift register and multiply the charge as the charge shifts through the fourth HCCD shift register.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1:
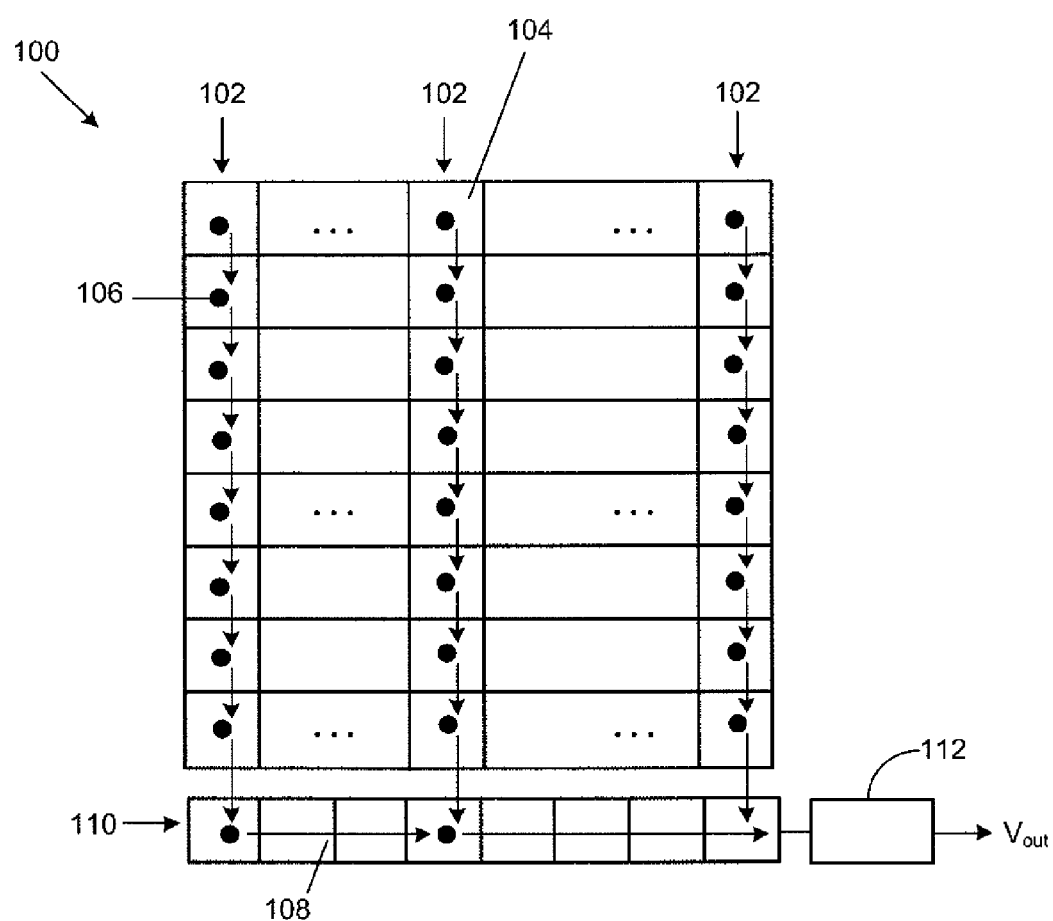
FIG. 1 is a simplified block diagram of a prior art CCD image sensor.
Figure 2:
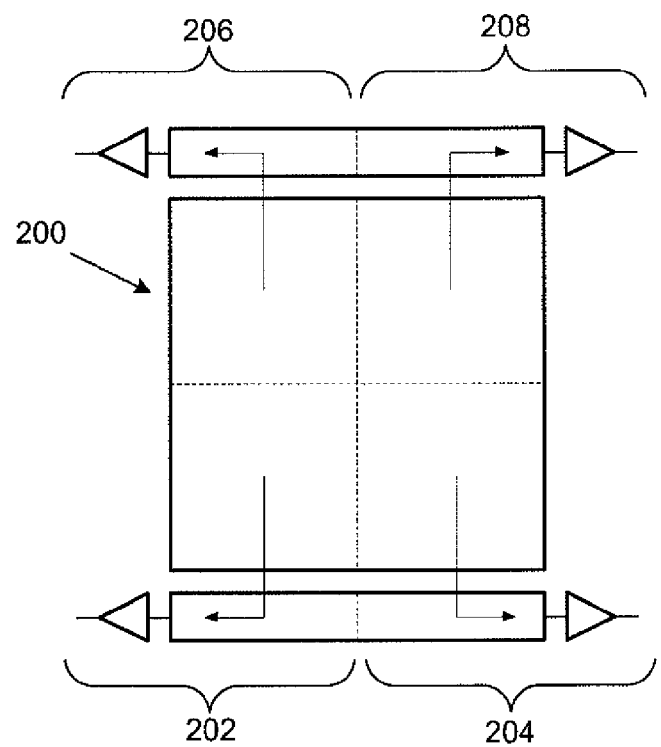
FIG. 2 is a simplified block diagram of a prior art image sensor with multiple output structures.
Figure 3:
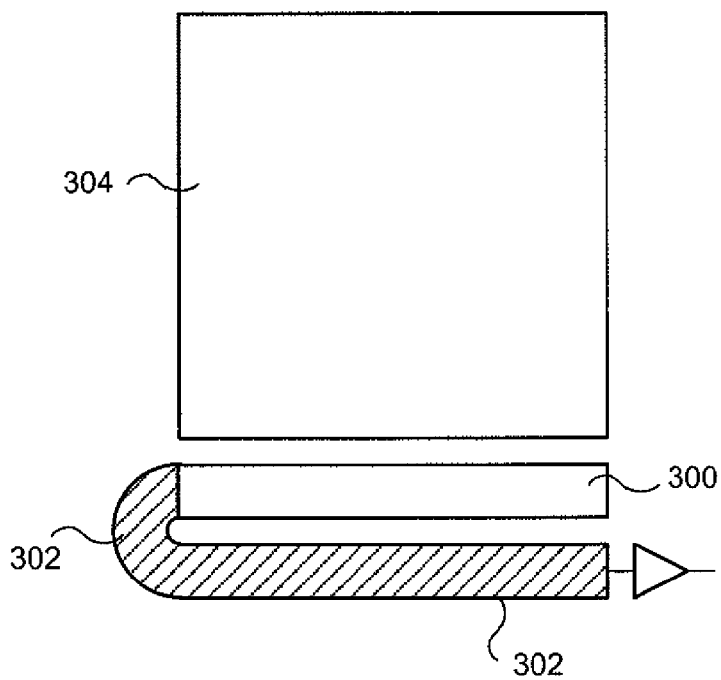
FIG. 3 illustrates a prior art image sensor that includes an extended horizontal CCD region.
Figure 4:
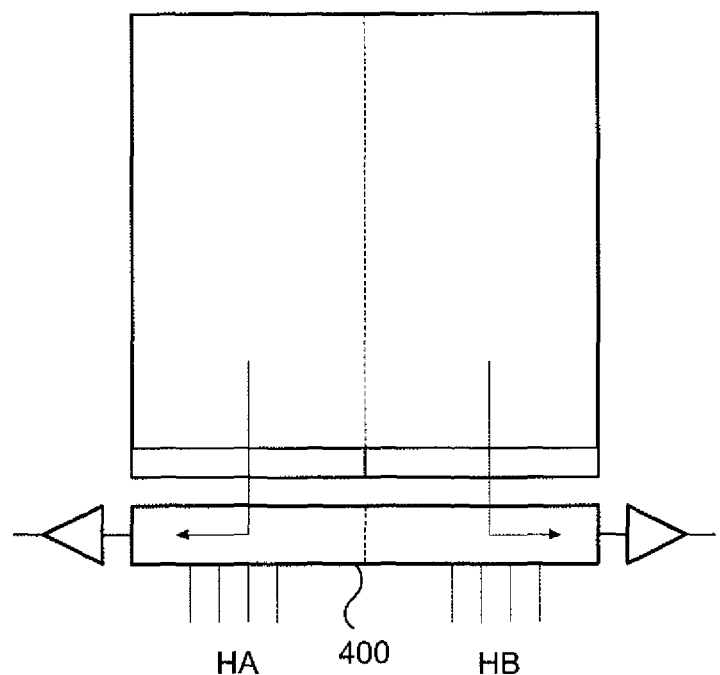
FIG. 4 depicts the operation of a prior art CCD image sensor during full image resolution readout mode.
Figure 5:
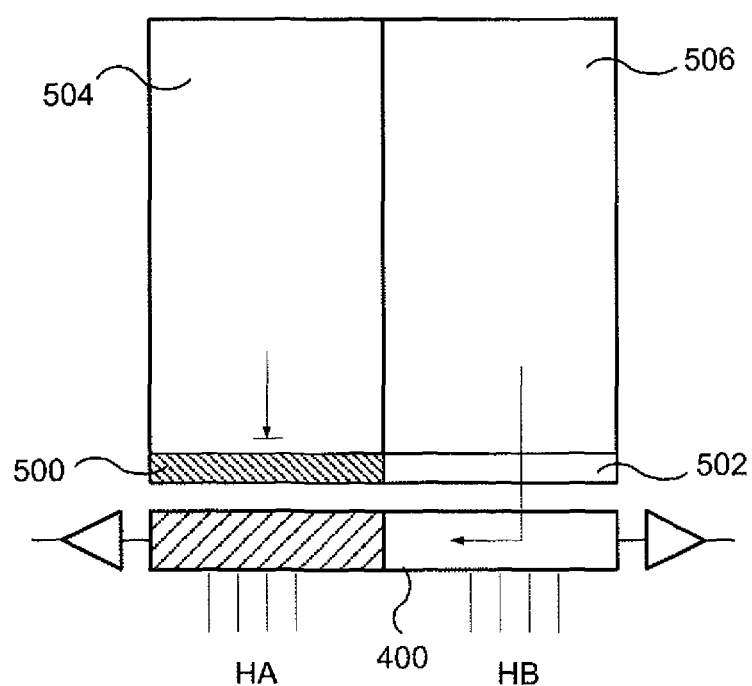
FIG. 5 illustrates the operation of the prior art CCD image sensor shown in FIG. 4 during a charge multiplication mode.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", "left", "right", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers. When used in conjunction with the construction or operation of an image sensor, the directional terminology is intended to be construed broadly, and therefore should not be interpreted to preclude alternate constructions or operations.

Referring to the drawings, like numbers indicate like parts throughout the views.

Figure 6:
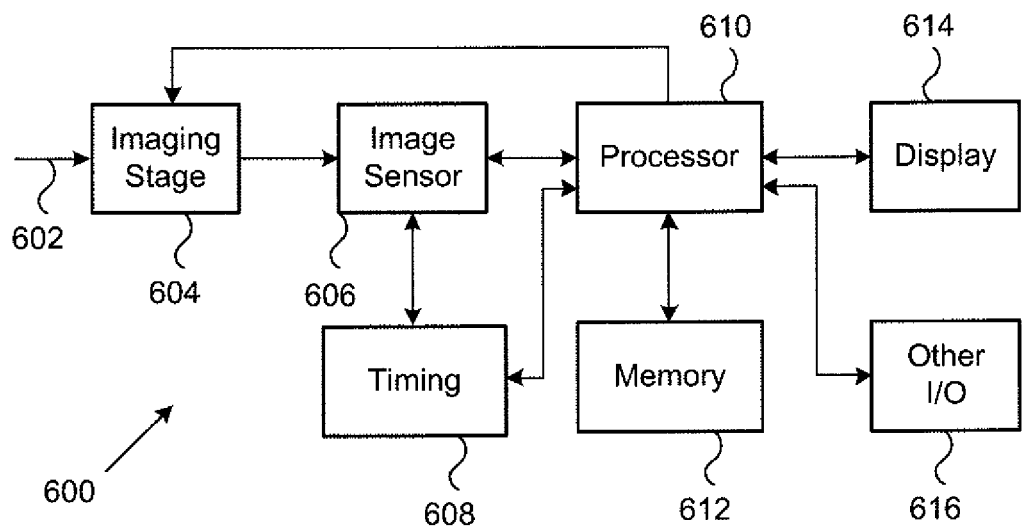
FIG. 6 is a simplified block diagram of an image capture device in an embodiment in accordance with the invention.

FIG. 6 is a simplified block diagram of an image capture device in an embodiment in accordance with the invention. Image capture device 600 is implemented as a digital camera in FIG. 6. Those skilled in the art will recognize that a digital camera is only one example of an image capture device that can utilize an image sensor incorporating the present invention. Other types of image capture devices, such as, for example, cell phone cameras, scanners, copiers, and digital video camcorders, can be used with the present invention.

In digital camera 600, light 602 from a subject scene is input to an imaging stage 604. Imaging stage 604 can include conventional elements such as a lens, a neutral density filter, an iris and a shutter. Light 602 is focused by imaging stage 604 to form an image on image sensor 606. Image sensor 606 captures one or more images by converting the incident light into electrical signals. Timing generator 608 transmits various control and timing signals to image sensor 606. The control and timing signals include the timing signals in the timing patterns needed to read out charge from image sensor 606 in an embodiment in accordance with the invention. Timing generator 608 represents one or more timing generators that produce various control and timing signals for image sensor 606. The one or more timing generators can be integrated with image sensor 606 or implemented separately from image sensor 606.

Digital camera 600 further includes processor 610, memory 612, display 614, and one or more additional input/output (I/O) elements 616. Although shown as separate elements in the embodiment of FIG. 6, imaging stage 604 may be integrated with image sensor 606, and possibly one or more additional elements of digital camera 600, to form a compact camera module.

Processor 610 may be implemented, for example, as a microprocessor, a central processing unit (CPU), an application-specific integrated circuit (ASIC), a digital signal processor (DSP), or other processing device, or combinations of multiple such devices. Various elements of imaging stage 604 and image sensor 606 may be controlled by timing signals or other signals supplied from processor 610 or timing generator 608. Based on the operating mode of digital camera 600, processor 610 is configured to control timing generator 608 in an embodiment in accordance with the invention. Processor 610 instructs timing generator 608 to produce various vertical CCD or horizontal CCD clocking signals depending on the operating mode of digital camera 600.

Memory 612 may be configured as any type of memory, such as, for example, random access memory (RAM), read-only memory (ROM), Flash memory, disk-based memory, removable memory, or other types of storage elements, in any combination. A given image captured by image sensor 606 may be stored by processor 610 in memory 612 and presented on display 614. Display 614 is typically an active matrix color liquid crystal display (LCD), although other types of displays may be used. The additional I/O elements 616 may include, for example, various on-screen controls, buttons or other user interfaces, network interfaces, or memory card interfaces.

It is to be appreciated that the digital camera shown in FIG. 6 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 7:
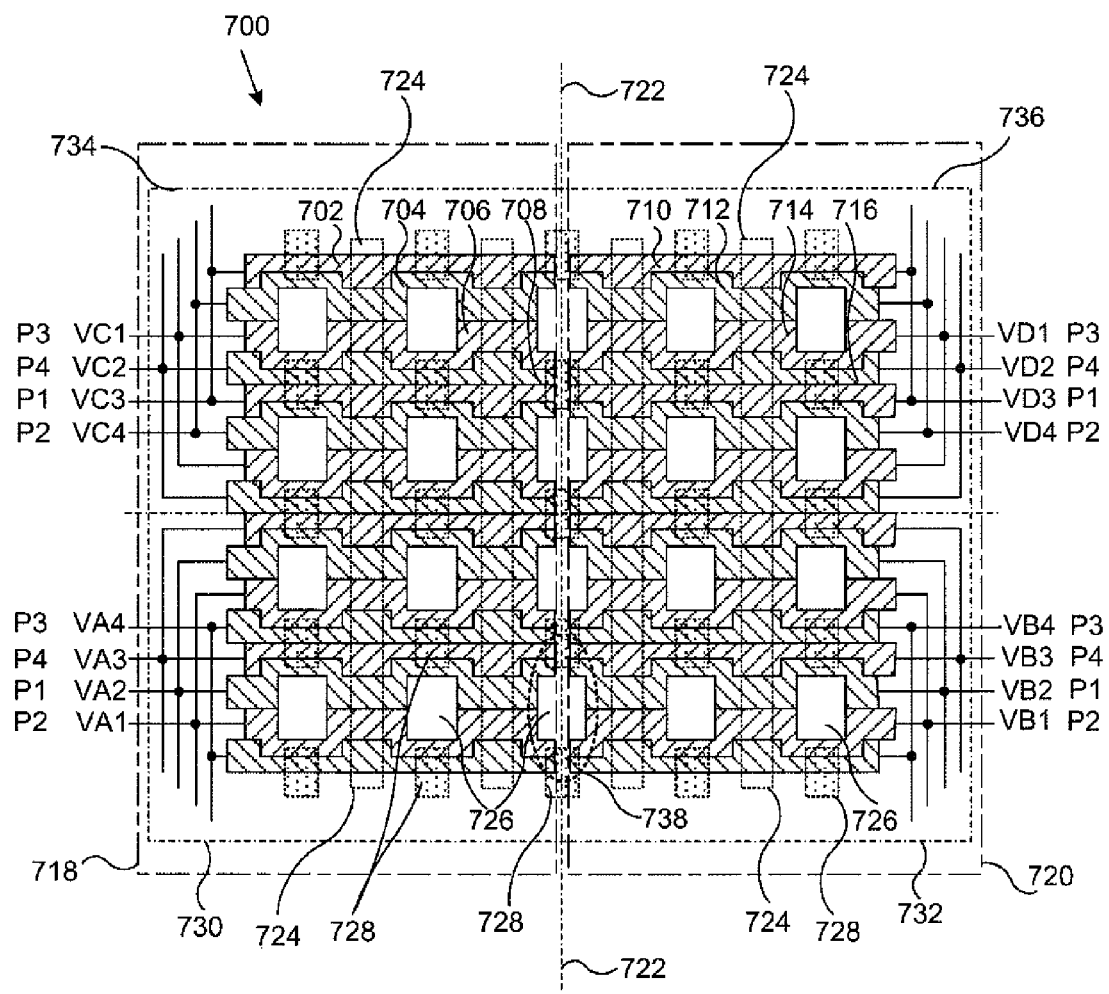
FIG. 7 is a top view of a pixel array that is suitable for use in image sensor 606 shown in FIG. 6 in an embodiment in accordance with the invention.

Referring now to FIG. 7, there is shown a top view of a pixel array that is suitable for use in image sensor 606 shown in FIG. 6 in an embodiment in accordance with the invention. The illustrated pixel array 700 is implemented as a four-phase interline CCD image sensor, but other embodiments in accordance with the invention can include three or more bidirectional phases.

As a four-phase CCD image sensor, four gate electrodes are disposed over each pixel. Gate electrodes 702, 704, 706, 708, 710, 712, 714, 716 are non-continuous or disrupted across the entire pixel array 700. Gate electrodes 702, 704, 706, 708, 710, 712, 714, 716 are physically divided into sections 718, 720 with the gate electrodes in section 718 physically discrete and electrically isolated from the gate electrodes in section 720. A physical gap is formed in the gate electrodes at a given location over pixel array 700. For example, the physical gap can be formed along line 722, which corresponds substantially to the middle of pixel array 700. Sections 718 and 720 include substantially the same number of pixels in an embodiment in accordance with the invention.

In an interline CCD image sensor, the VCCD shift registers 724 isolate the photosensitive areas 726 horizontally because the VCCD shift registers 724 are disposed between adjacent columns of photosensitive areas 726. Vertical isolation of the photosensitive areas 726 is achieved by means of a field oxide channel stop or appropriate barrier implant 728 formed between each photosensitive area 726, including between the photosensitive areas 726 underlying the physical gap (e.g., the photosensitive regions along line 722).

Gate electrodes 702, 704, 706, 708 in section 718 are controlled by independent sets of VCCD clocking signals, $V_A$ and $V_C$. Gate electrodes 710, 712, 714, 716 in section 720 are controlled by independent sets of VCCD clocking signals, $V_B$ and $V_D$. Depending on the timing patterns produced for VCCD clocking signals, $V_A$, $V_B$, $V_C$ and $V_D$, charge packets can be shifted or transferred to one, two, or four output channels (output channels not shown). Pixel array 700 can be configured electrically to operate as a whole pixel array, two sections 718, 720 of a pixel array, or four groups 730, 732, 734, 736 of a pixel array. Examples of these different operations will be described in more detail in conjunction with FIGS. 12-14.

Group 730 of gate electrodes is controlled by an independent set of VCCD clocking signals $V_{A1}$, $V_{A2}$, $V_{A3}$, $V_{A4}$. Group 732 of gate electrodes is controlled by an independent set of VCCD clocking signals $V_{B1}$, $V_{B2}$, $V_{B3}$, $V_{B4}$. Group 734 of gate electrodes is controlled by an independent set of VCCD clocking signals $V_{C1}$, $V_{C2}$, $V_{C3}$, $V_{C4}$. Group 736 of gate electrodes is controlled by an independent set of VCCD clocking signals $V_{D1}$, $V_{D2}$, $V_{D3}$, and $V_{D4}$. Those skilled in the art will recognize that a different number of VCCD clocking signals can be utilized in other embodiments in accordance with the invention.

An HCCD shift register 800 is electrically connected to the VCCD shift registers included in each section of the pixel array (e.g., sections 718 and 720 in FIG. 7). Thus, four distinct HCCD shift registers are electrically connected to pixel array 700 in the illustrated embodiment. Other embodiments can connect a different number of HCCD shift registers to the pixel array. For example, two HCCD shift registers can be connected to pixel array 700.

Figure 8:
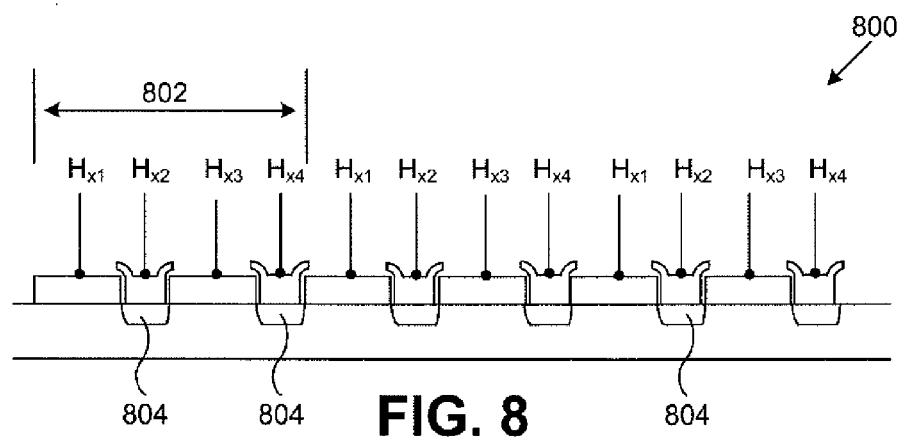
FIG. 8 depicts an arrangement of gate electrodes in a horizontal CCD in an embodiment in accordance with the invention.

The HCCD shift registers can be constructed and operated as described in U.S. Pat. No. 7,522,205 in an embodiment in accordance with the invention. FIG. 8 depicts an HCCD shift register 800 as disclosed in U.S. Pat. No. 7,522,205. Four gate electrodes $H_{x1}$, $H_{x2}$, $H_{x3}$, $H_{x4}$ are used per pixel 802 (or per column) and a barrier implant 804 is added to every other gate (e.g., $H_{x2}$ and $H_{x4}$) such that it becomes possible to clock the signals in either direction using a pseudo two-phase clocking pattern. The letter "x" in FIG. 8 corresponds to the group letter A, B, C, and D. For example, an HCCD shift register 800 electrically connected to group 730 has four clocking signals $H_{A1}$, $H_{A2}$, $H_{A3}$, $H_{A4}$. Similarly, an HCCD shift register 800 electrically connected to group 734 has four clocking signals $H_{C1}$, $H_{C2}$, $H_{C3}$, $H_{C4}$. VCCD clocking delays can be avoided by periodically strapping the gates with metal as described in U.S. Pat. No. 7,102,185.

Figure 9:
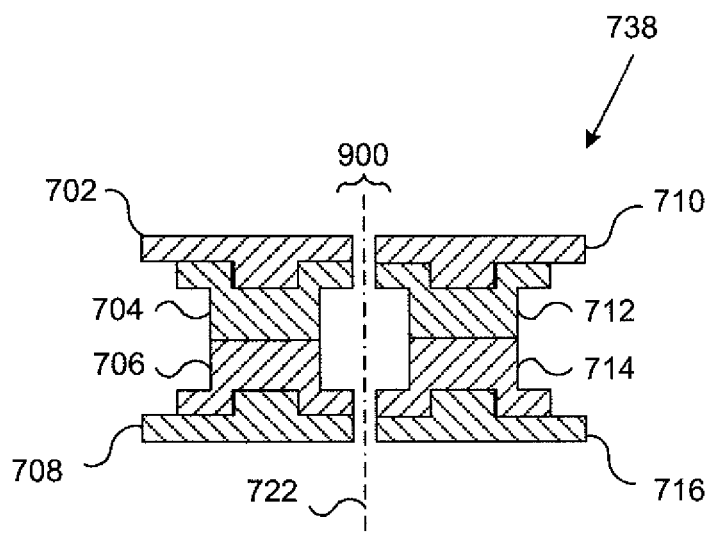
FIG. 9 is an expanded view of region 738 shown in FIG. 7.

FIG. 9 is an expanded view of region 738 shown in FIG. 7. Physical gap 900 is situated between gate electrodes 702, 704, 706, 708 and gate electrodes 710, 712, 714, 716. Physical gap 900 disrupts the gate electrodes disposed over the VCCDs to produce sections 718, 720. Physical gap 900 electrically isolates gate electrodes 702, 704, 706, 708 in section 718 from gate electrodes 710, 712, 714, 716 in section 720. Physical gap 900 can be produced using several methods. An exemplary method is described in conjunction with FIG. 15.

Figure 10:
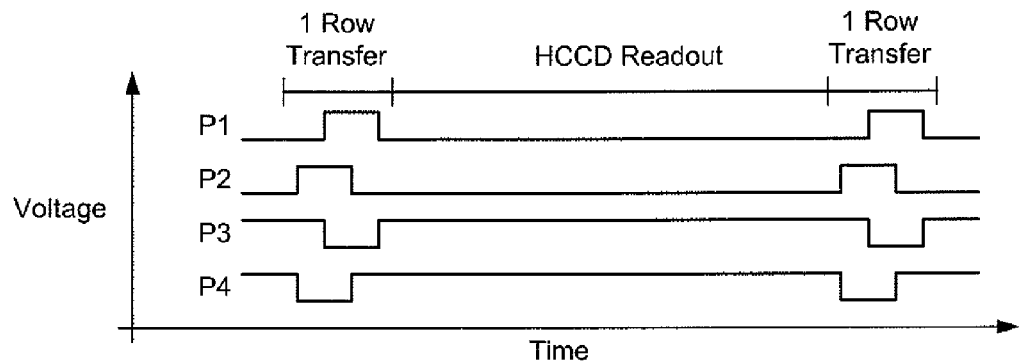
FIG. 10 illustrates one example of timing patterns suitable for use with image sensor 700 shown in FIG. 7 in an embodiment in accordance with the invention.

Referring now to FIG. 10, there is shown one example of timing patterns suitable for use with image sensor 700 shown in FIG. 7 in an embodiment in accordance with the invention. To operate image sensor 700 in the full resolution charge multiplication mode, VCCD clocking signals $V_A$ and $V_C$ are clocked to transfer rows of pixels in groups 730 and 734 in one direction while VCCD clocking signals $V_B$ and $V_D$ are clocked to transfer rows of pixels in groups 732 and 736 in the opposite direction. By way of example only, electrical timing patterns P1, P2, P3, P4 illustrated in FIG. 10 are produced and applied to the appropriate phase pins P1, P2, P3, and P4 shown in FIG. 7 and defined in the table of FIG. 14. In this illustrated embodiment, VCCD gate electrode $V_{A1}$ is to be clocked using the pattern P2 defined in FIG. 10. Likewise, VCCD gate electrode $V_{A2}$ is clocked using the pattern P1, and so on for gate electrodes $V_{A3}$, $V_{A4}$, $V_{B1}$, $V_{B2}$, $V_{B3}$, $V_{B4}$, $V_{C1}$, $V_{C2}$, $V_{C3}$, $V_{C4}$, $V_{D1}$, $V_{D2}$, $V_{D3}$, and $V_{D4}$.

Figure 11:
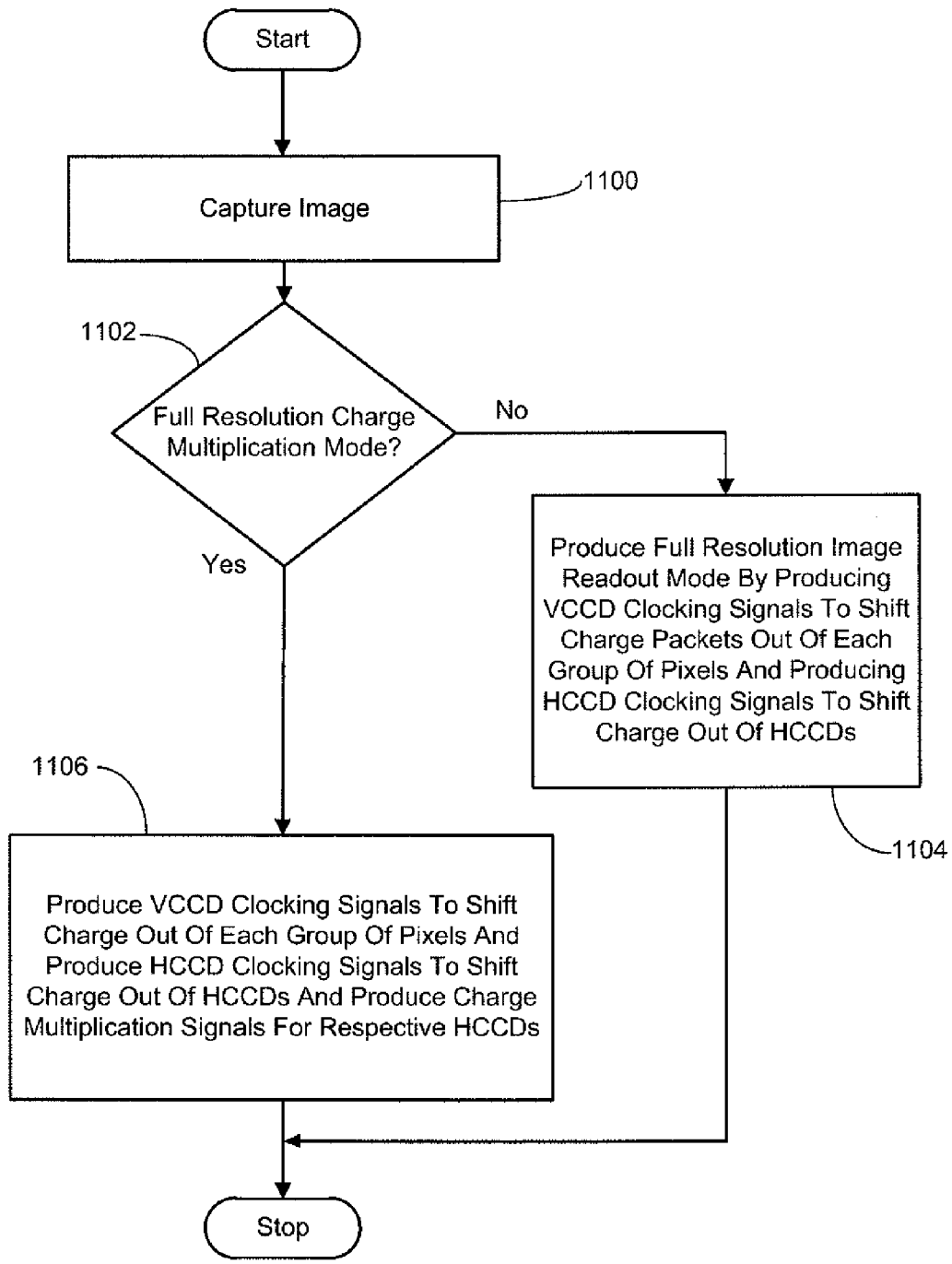
FIG. 11 is a flowchart of a method for reading out an image from a CCD image sensor in an embodiment in accordance with the invention.

FIG. 11 is a flowchart of a method for reading out an image from a CCD image sensor in an embodiment in accordance with the invention. The image sensor is configured to operate in two operating modes in the illustrated embodiment. The two operating modes are a full resolution charge multiplication mode and a full resolution image readout mode. Other embodiments in accordance with the invention can operate with additional or different operating modes. By way of example only, a CCD image sensor can be configured to operate in a reduced resolution image readout mode. The reduced resolution image readout mode can sum or bin charge packets in the VCCDs, the HCCDs, or both the VCCDs and HCCDs using binning methods known in the art.

Initially, an image is captured by the image sensor (block 1100). A determination is then made at block 1102 as to whether or not the image is to be read out in a full resolution charge multiplication mode. In one embodiment in accordance with the invention, a controller or processor in an image capture device determines which operating mode the image sensor is to be configured into to read out one or more images.

If the full resolution charge multiplication mode is not utilized, the method passes to block 1104 where the image is read out in a full resolution image readout mode. In the full resolution image readout mode, VCCD clocking signals are produced to shift the charge out of the pixel array on a row by row basis. HCCD clocking signals are produced to shift each row of charge out of the HCCDs.

Returning again to block 1102, if the full resolution charge multiplication mode is utilized, VCCD clocking signals are produced to shift the charge out of the pixel array on a row by row basis (block 1106). HCCD clocking signals are produced to shift each row of charge through the HCCDs, with charge multiplication signals being produced and applied to particular HCCDs or a portion of each HCCD. The charge multiplication signals typically have larger signal levels than the HCCD clocking signals, and the charge multiplication signals are applied to the electrode gates overlying a portion of each HCCD in an embodiment in accordance with the invention.

Figure 12:
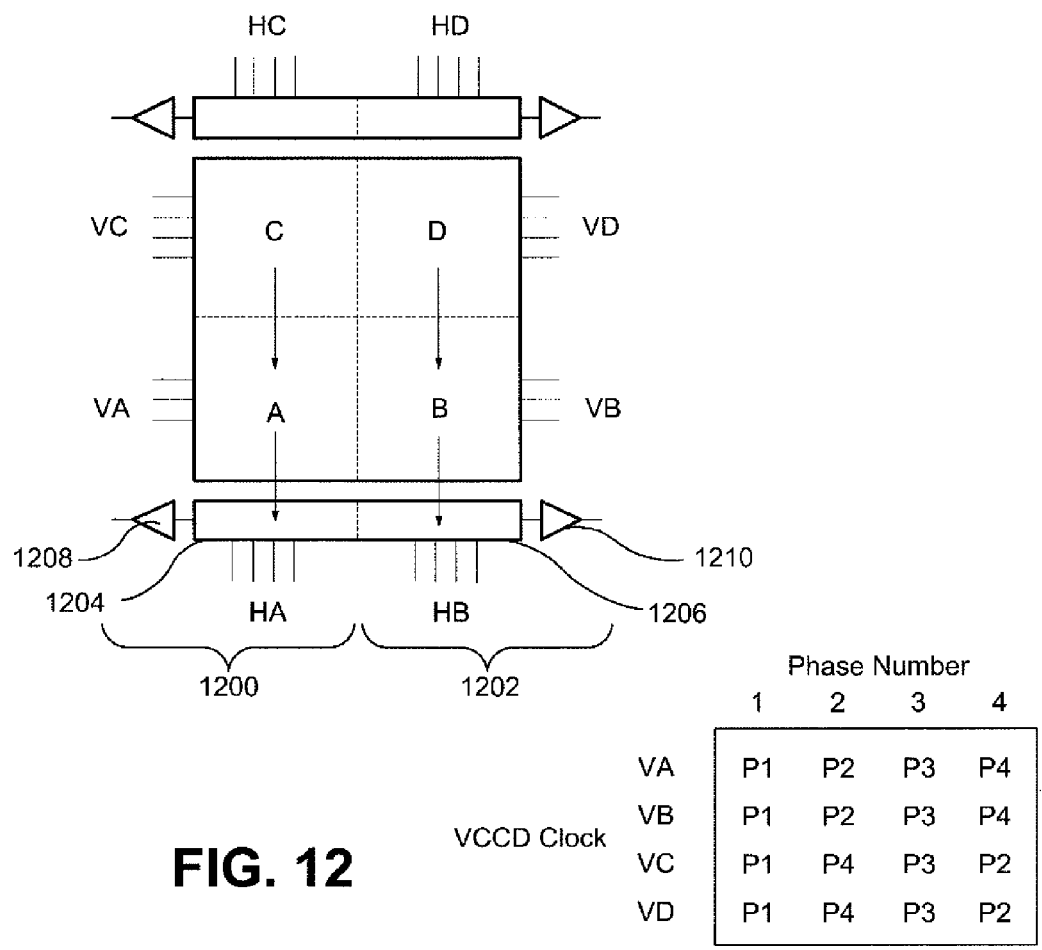
FIG. 12 a first example of a full resolution image readout mode suitable for use in block 1104 shown in FIG. 11 using the timing patterns of FIG. 10 in an embodiment in accordance with the invention.

Referring now to FIG. 12, there is shown a first example of a full resolution image readout mode suitable for use in block 1104 shown in FIG. 11 using the timing patterns of FIG. 10 in an embodiment in accordance with the invention. VCCD clocking signals $V_A$, $V_B$, $V_C$, $V_D$ for groups of pixels A, B, C, D are configured to shift charge in only one direction and into only two output channel structures 1200, 1202. Output channel structures 1200, 1202 each include a HCCD 1204, 1206 and an output circuit 1208, 1210.

HCCD clocking signals $H_A$ and $H_B$ can be produced and applied to the overlying electrode gates in each HCCD 1204, 1206 to shift the charge packets to one output circuit in only one output channel structure. For example, the charge packets in one HCCD 1204 or 1206 can be shifted to output circuit 1208. Alternatively, the HCCD clocking signals $H_A$ and $H_B$ can be produced and applied to the overlying electrode gates in each HCCD 1204, 1206 to shift the charge packets to the output circuit in both output channel structures. The charge packets within HCCD 1206 can be shifted to output circuit 1210 while the charge in HCCD 1204 is shifted to output circuit 1208.

Electrical timing patterns P1, P2, P3, P4 shown in FIG. 10 are applied to the phases 1, 2, 3, 4 of the electrode gates in the illustrated embodiment. By way of example only, in FIG. 7 electrodes 702 and 710 correspond to phase 1, electrodes 704 and 712 to phase 2, electrodes 706 and 714 to phase 3, and electrodes 708 and 716 to phase 4. Thus, for VCCD clocking signals $V_A$, $V_B$, $V_C$, $V_D$, pattern P1 is applied to the phase 1 electrode gates, pattern P2 to phase 2 electrode gates, pattern P3 to phase 3 electrode gates, and pattern P4 to the phase 4 electrode gates. Application of the patterns P1, P2, P3, P4 to the four phases of electrode gates overlying each pixel cause the charge in all four groups of pixels A, B, C, D to transfer or shift to HCCDs 1208, 1210.

Figure 13:
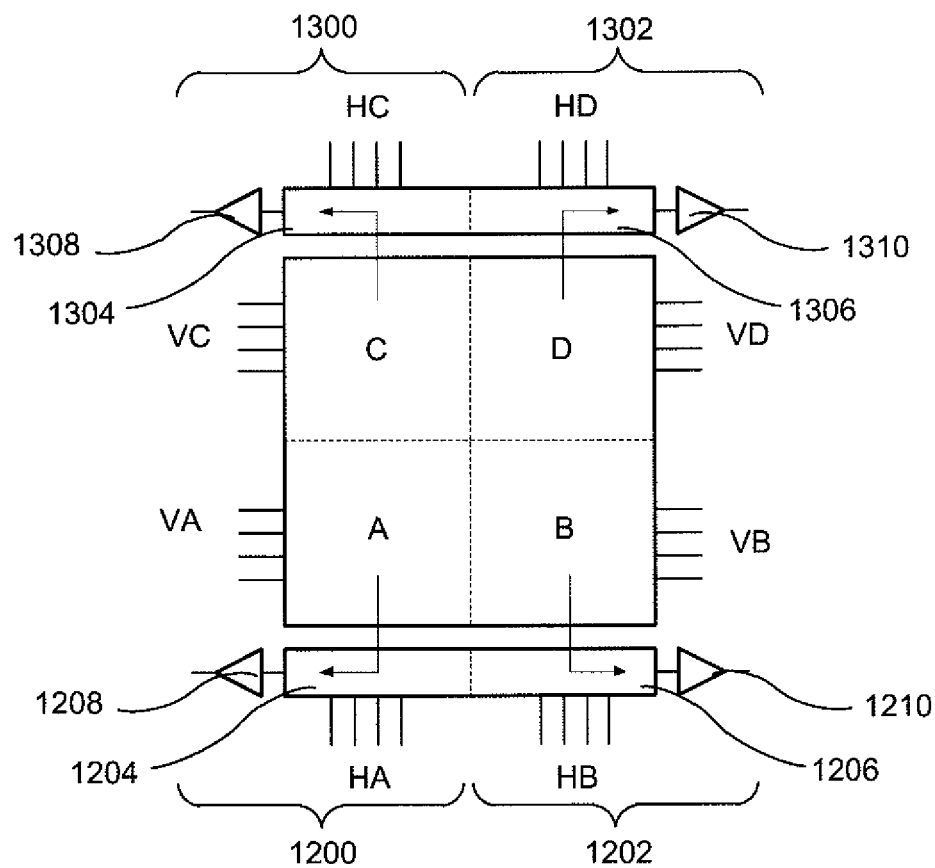
FIG. 13 a second example of a full resolution image readout mode suitable for use in block 1104 shown in FIG. 11 using the timing patterns of FIG. 10 in an embodiment in accordance with the invention.

FIG. 13 is a second example of a full resolution image readout mode suitable for use in block 1104 shown in FIG. 11 using the timing patterns of FIG. 10 in an embodiment in accordance with the invention. VCCD clocking signals $V_A$ and $V_B$ for groups of pixels A and B, respectively, are configured to transfer or shift charge in one direction to output channel structures 1200, 1202. VCCD clocking signals $V_C$ and $V_D$ for groups of pixels C and D, respectively, are configured to transfer or shift charge in an opposite direction to output channel structures 1300, 1302. Output channel structures 1200, 1202 each include a HCCD 1204, 1206 and an output circuit 1208, 1210. Output channel structures 1300, 1302 each include a HCCD 1304, 1306 and an output circuit 1308, 1310.

HCCD clocking signals $H_A$ are produced and applied to the overlying electrode gates in HCCD 1204 to shift the charge within HCCD 1204 to output circuit 1208. HCCD clocking signals $H_B$ are produced and applied to the electrode gates in HCCD 1206 to shift the charge within HCCD 1206 to output circuit 1210. HCCD clocking signals $H_C$ are produced and applied to the electrode gates in HCCD 1304 to shift the charge within HCCD 1304 to output circuit 1308. HCCD clocking signals $H_D$ are produced and applied to the overlying electrode gates in HCCD 1306 to shift the charge within HCCD 1306 to output circuit 1310. Other embodiments in accordance with the invention can produce and apply HCCD clocking signals $H_A$ and $H_B$ to the electrode gates in HCCD shift registers 1204, 1206 to shift the charge to only one output circuit (e.g, output circuit 1210) while HCCD clocking signals $H_C$ and $H_D$ can be produced and applied to the electrode gates in HCCD shift registers 1304, 1306 to shift the charge to only one output circuit (e.g., 1308).

Electrical timing patterns P1, P2, P3, P4 shown in FIG. 10 are applied to the phases 1, 2, 3, 4 of the electrode gates overlying each pixel. Thus, for VCCD clocking signals $V_A$ and $V_B$, pattern P1 is applied to the phase 1 electrode gates, pattern P2 to phase 2 electrode gates, pattern P3 to phase 3 electrode gates, and pattern P4 to the phase 4 electrode gates. For VCCD clocking signals $V_C$ and $V_D$, pattern P2 is applied to the phase 1 electrode gates, pattern P3 to phase 2 electrode gates, pattern P4 to phase 3 electrode gates, and pattern P1 to the phase 4 electrode gates. Application of the patterns P1, P2, P3, P4 as shown to the four phases of electrode gates cause the charge in pixel groups A and B to transfer or shift to HCCD shift registers 1204, 1206 and the charge in pixel groups C and D to shift to HCCD shift registers 1304, 1306.

Figure 14:
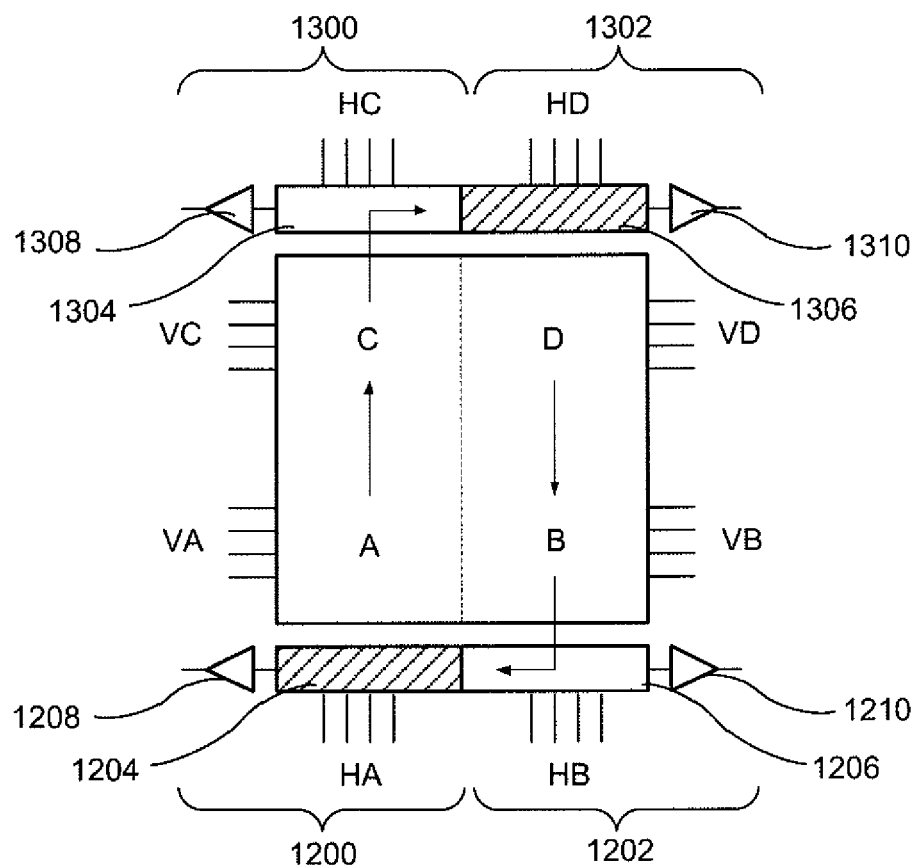
FIG. 14 depicts an example of a full resolution charge multiplication mode suitable for use in block 1106 shown in FIG. 11 using the timing patterns of FIG. 10 in an embodiment in accordance with the invention.

Referring now to FIG. 14, there is shown an example of a full resolution charge multiplication mode suitable for use in block 1106 shown in FIG. 11 using the timing patterns of FIG. 10 in an embodiment in accordance with the invention. VCCD clocking signals $V_A$ and $V_C$ for groups of pixels A and C are configured to transfer or shift charge packets in one direction to output channel structure 1300. VCCD clocking signals VB and VD for groups of pixels B and D are configured to transfer or shift charge packets in an opposite direction to output channel structure 1202.

HCCD clocking signals $H_C$ are produced and applied to the electrode gates in HCCD 1304 to shift the charge packets within HCCD 1304 to HCCD 1306 in output channel structure 1302. HCCD clocking signals $H_D$ are produced and applied to the electrode gates in HCCD 1306 to operate HCCD 1306 in a charge multiplication mode and to shift the charge packets to output circuit 1310. Similarly, HCCD clocking signals $H_B$ are produced and applied to the electrode gates in HCCD 1206 to shift the charge packets within HCCD 1206 to HCCD 1204 in output channel structure 1200. HCCD clocking signals $H_A$ are produced and applied to the electrode gates in HCCD 1204 to operate HCCD 1204 in a charge multiplication mode and to shift the charge packets to output circuit 1208.

Electrical timing patterns P1, P2, P3, P4 shown in FIG. 10 are applied to the phases 1, 2, 3, 4 of the VCCD electrode gates overlying each pixel. Thus, for VCCD clocking signal $V_A$, pattern P2 is applied to the phase 1 electrode gates, pattern P1 to phase 2 electrode gates, pattern P4 to phase 3 electrode gates, and pattern P3 to the phase 4 electrode gates. For VCCD clocking signal $V_B$, pattern P1 is applied to the phase 1 electrode gates, pattern P2 to phase 2 electrode gates, pattern P3 to phase 3 electrode gates, and pattern P4 to the phase 4 electrode gates. For VCCD clocking signal $V_C$, pattern P2 is applied to the phase 1 electrode gates, pattern P3 to phase 2 electrode gates, pattern P4 to phase 3 electrode gates, and pattern P1 to the phase 4 electrode gates. And finally, for VCCD clocking signal $V_D$, pattern P1 is applied to the phase 1 electrode gates, pattern P4 to phase 2 electrode gates, pattern P3 to phase 3 electrode gates, and pattern P2 to the phase 4 electrode gates. Application of the patterns P1, P2, P3, P4 as shown to the four phases of the electrode gates cause the charge in pixel groups A and C to transfer or shift to HCCD 1304 and the charge in pixel groups D and B to shift to HCCD 1206.

Those skilled in the art will appreciate that in another embodiment in accordance with the invention the charge packets in groups A and C can be transferred to HCCD 1204 and the charge packets in groups B and D shifted to HCCD 1306. HCCD clocking signals $H_A$ are then produced and applied to shift the charge packets to HCCD 1206. HCCD clocking signals $H_B$ are produced and applied to the electrode gates in HCCD 1206 to operate HCCD 1206 in a charge multiplication mode and to shift the charge packets to output circuit 1210. Similarly, HCCD clocking signals $H_D$ are produced and applied to shift the charge packets to HCCD 1304. HCCD clocking signals $H_C$ are produced and applied to the electrode gates in HCCD 1304 to operate HCCD 1304 in a charge multiplication mode and to shift the charge packets to output circuit 1308.

Figure 15:
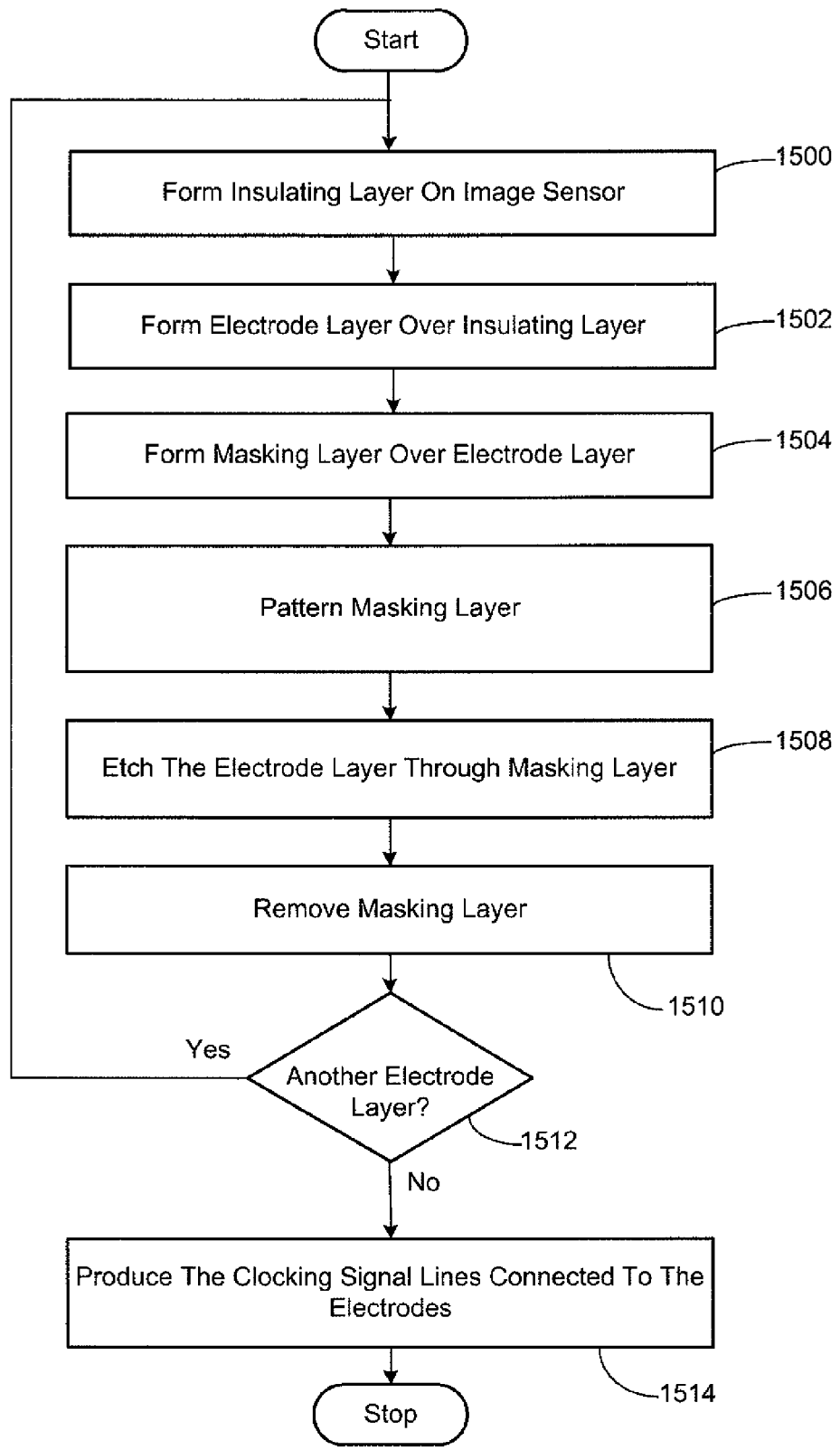
FIG. 15 is a flowchart of a method for producing the gate electrodes over a pixel array in an embodiment in accordance with the invention.

FIG. 15 is a flowchart of a method for producing the gate electrodes over a pixel array in an embodiment in accordance with the invention. Initially, an insulator layer is formed on an image sensor as shown in block 1500. An electrode layer is subsequently formed on top of the insulator layer (block 1502) and a masking layer formed over the electrode layer (block 1504). By way of example only, a photoresist layer can be used as a masking layer that is deposited over the electrode layer.

Next, as shown in block 1506, the masking layer is patterned and subsequently used to define or etch the gate electrodes in one gate electrode layer, as shown in block 1508. The gate electrode layer can be produced using a method known in the art. For example, the gate electrode layer can be produced by depositing a polysilicon or ITO material over the insulating layer. The gate electrodes are etched to produce a physical gap in the gate electrode layer. The physical gap produces two sections of gate electrodes that are physically separate and electrically isolated from one another. The gate electrodes in the gate electrode layer are non-continuous over the pixel array.

The gate electrode layer can include one set of gate electrodes or multiple gate electrodes representing different phases. For example, for a two-phase or three-phase CCD image sensor, the masking layer is patterned to define one (e.g., the first) phase of gate electrodes. In a four-phase or five-phase CCD image sensor, the masking layer is patterned to define two phases of gate electrodes, such as the first and third (or odd numbered) phases. Alternatively, the two phases of gate electrodes can be the second and fourth (or even numbered) phases.

The masking layer is then removed at block 1510. A determination is made at block 1512 as to whether or not another gate electrode layer is to be produced. For example, in a two-phase CCD image sensor, the second layer of gate electrodes representing another phase of gate electrodes (e.g., the second) needs to be produced. In a four-phase CCD image sensor, the second layer of gate electrodes representing the remaining two phases needs to be produced.

If another layer of gate electrodes is to be produced, the process returns to block 1500 and repeats until all of the gate electrode layers are produced. When all of the gate electrode layers have been produced, the method passes to block 1514 where the clocking signal lines connected to the phases of gate electrodes are produced. The clocking signal lines can be fabricated using any method known in the art.

Embodiments in accordance with the invention include an array of pixels having VCCD shift registers formed therein. Gate electrodes are disposed over the VCCD shift registers. The gate electrodes can correspond to N phases per pixel, with N being an integer greater than or equal to one. A physical gap is situated in the gate electrodes such that one section of gate electrodes is physically distinct and electrically isolated from another section of gate electrodes. The sections of gate electrodes can operate as one array and shift all of the charge in one direction to two output channel structures. Alternatively, the sections can function as two sections and shift charge in each section in opposite directions. The HCCD shift registers that do not receive charge directly from a section can operate in a charge multiplication mode. As another alternative, the sections can be divided electrically into groups and shift the charge in each group to an HCCD shift register. Sets of independently-controllable VCCD clocking signals allow charge to be shifted in two directions (e.g., up or down). The timing patterns applied to the VCCD clocking signals can be modified during the operation of an image sensor to switch between the different operating modes.

Each HCCD shift register is connected to a set of independently-controllable HCCD clocking signals that allow charge to be shifted in two directions (e.g., to the left or to the right). When the charge in the VCCD shift registers are shifted in two opposing directions and two HCCD shift registers on opposite sides of the array of pixels receive the charge directly from the VCCD shift registers, the two HCCD shift registers that do not receive charge directly from the VCCD shift registers can be used to perform charge multiplication.

The invention has been described in detail with particular reference to certain embodiments thereof, but it will be understood that variations and modifications can be effected within the spirit and scope of the invention. For example, embodiments in accordance with the invention have been described in conjunction with a two-phase and four-phase interline CCD image sensor. Other embodiments in accordance with the invention can include three or more phases. Moreover, the image sensor can be implemented as another type of a CCD image sensor, such as a full frame or virtual phase CCD image sensor.

And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

1. An image sensor can include multiple vertical charge-coupled device (VCCD) shift registers and multiple independently-controllable gate electrodes disposed over the VCCD shift registers and arranged into physically separate and distinct sections that are non-continuous across the VCCD shift registers.

2. The image sensor in the preceding clause 1 can further include multiple horizontal charge-coupled device (HCCD) shift registers each including charge storage elements, wherein each charge storage element is connected to a respective VCCD shift register to receive charge directly from the respective VCCD shift register.

3. The image sensor in any one of the preceding clauses 1 or 2 can further include one or more timing generators configured to produce VCCD clocking signals applied to respective independently-controllable gate electrodes for shifting charge through the VCCD shift registers and into respective HCCD shift registers.

4. The image sensor in any one of the preceding clauses 1-3 can further include one or more timing generators configured to produce HCCD clocking signals applied to respective gate electrodes for shifting charge through the HCCD shift registers, where the one or more timing generators is configured to produce VCCD and HCCD clocking signals for a full resolution image readout mode and a full resolution charge multiplication mode.

5. The image sensor as in any one of the preceding clauses 1-4 where two HCCD shift registers are disposed on one side of the VCCD shift registers and two HCCD shift registers are disposed on an opposite side of the VCCD shift registers.

5. The image sensor as in any one of the preceding clauses 1-4 where all of the shift elements in at least two HCCD shift registers receive charge directly from respective VCCD shift registers during the full resolution image readout mode and all of the shift elements in two HCCD shift registers on opposite sides of the VCCD shift registers receive charge directly from respective VCCD shift registers during a full resolution charge multiplication mode.

6. An image sensor can include a pixel array including multiple vertical charge-coupled device (VCCD) shift registers, a first section of independently-controllable gate electrodes disposed over a portion of the VCCD shift registers, a second section of independently-controllable gate electrodes disposed over another discrete portion of the VCCD shift registers, and a physical gap physically separating the first section of independently-controllable gate electrodes from the second section of independently-controllable gate electrodes such that the gate electrodes in the first and second sections are non-continuous across the entire pixel array.

7. The image sensor in the preceding clause 6 can further include multiple horizontal charge-coupled device (HCCD) shift registers each including charge storage elements, where each charge storage element is connected to a respective VCCD shift register to receive charge directly from the respective VCCD shift register.

8. The image sensor in any one of the preceding clauses 6 or 7 can further include one or more timing generators configured to produce VCCD clocking signals applied to respective independently-controllable gate electrodes for shifting charge through the VCCD shift registers and into respective HCCD shift registers.

9. The image sensor in any one of the preceding clauses 6-8 can further include one or more timing generators configured to produce HCCD clocking signals applied to respective gate electrodes for shifting charge through the HCCD shift registers.

10. An image capture device can be configured to operate in two or more modes, where one of the operating modes is a full resolution charge multiplication mode. The image capture device can include multiple vertical charge-coupled device (VCCD) shift registers, multiple independently-controllable gate electrodes disposed over the VCCD shift registers and arranged into physically separate and distinct sections that are non-continuous across the VCCD shift registers, multiple horizontal charge-coupled device (HCCD) shift registers each including charge storage elements, and one or more timing generators configured to produce VCCD clocking signals applied to respective independently-controllable gate electrodes for shifting charge through the VCCD shift registers and configured to produce HCCD clocking signals applied to respective gate electrodes for shifting charge through the HCCD shift registers.

11. The image capture device in the preceding clause 10 can further include a processor operable to control the production of VCCD and HCCD clocking signals by the one or more timing generators based on the respective operating mode of the image capture device.

12. The image capture device as in any one of the preceding clauses 10 or 11, where each charge storage element in the horizontal charge-coupled device (HCCD) shift registers is connected to a respective VCCD shift register to receive charge directly from the respective VCCD shift register.

13. An image capture device can be configured to operate in two or more modes, where one of the operating modes is a full resolution charge multiplication mode. The image capture device can include a pixel array including multiple vertical charge-coupled device (VCCD) shift registers, a first section of independently-controllable gate electrodes disposed over a portion of the VCCD shift registers, a second section of independently-controllable gate electrodes disposed over another discrete portion of the VCCD shift registers, a physical gap physically separating the first section of independently-controllable gate electrodes from the second section of independently-controllable gate electrodes such that the gate electrodes in the first and second sections are non-continuous across the entire pixel array, multiple horizontal charge-coupled device (HCCD) shift registers each including charge storage elements, and one or more timing generators configured to produce VCCD clocking signals applied to respective independently-controllable gate electrodes for shifting charge through the VCCD shift registers and configured to produce HCCD clocking signals applied to respective gate electrodes for shifting charge through the HCCD shift registers.

14. The image capture device in the preceding clause 13 can further include a processor operable to control the production of VCCD and HCCD clocking signals by the one or more timing generators based on the respective operating mode of the image capture device.

15. The image capture device as in any one of the preceding clauses 13 or 14, where each charge storage element in the horizontal charge-coupled device (HCCD) shift registers is connected to a respective VCCD shift register to receive charge directly from the respective VCCD shift register.

16. A method for operating an image sensor including an array of pixels that includes vertical charge-coupled device (VCCD) shift registers, multiple independently-controllable gate electrodes disposed over the VCCD shift registers that are configured into two physically distinct sections, and multiple horizontal charge-coupled device (HCCD) shift registers configured to receive charge directly from respective VCCD shift registers, the method can include applying VCCD clocking signals to one section of gate electrodes to shift charge from the VCCD shift registers corresponding to the one section of gate electrodes directly into respective charge storage elements in a first HCCD shift register; applying VCCD clocking signals to the other section of gate electrodes to shift charge from the VCCD shift registers corresponding to the other section of gate electrodes directly into respective charge storage elements in a second HCCD shift register; applying HCCD clocking signals to gate electrodes disposed over the first HCCD shift register to shift the charge through the first HCCD shift register and into a third HCCD shift register; applying HCCD clocking signals to gate electrodes disposed over the second HCCD shift register to shift the charge through the second HCCD shift register into a fourth HCCD shift register; applying HCCD clocking signals to gate electrodes disposed over the third HCCD shift register to shift the charge through the third HCCD shift register and multiply the charge as the charge shifts through the third HCCD shift register; and applying HCCD clocking signals to gate electrodes disposed over the fourth HCCD shift register to shift the charge through the fourth HCCD shift register and multiply the charge as the charge shifts through the fourth HCCD shift register.

17. The method in the preceding clause 16 can further include determining if the image sensor is configured to operate in a full resolution charge multiplication mode.

18. A method for producing an image sensor comprising an array of pixels that includes vertical charge-coupled device (VCCD) shift registers, the method can include forming a first layer of gate electrodes over the VCCD shift registers and forming a physical gap in the first layer of gate electrodes such that first and second sections of gate electrodes are produced and are physically separated and electrically isolated from each other.

19. The method in the preceding clause 18 can further include forming a second layer of gate electrodes over the first and second sections of gate electrodes in the first layer and forming another physical gap in the second layer of gate electrodes such that first and second sections of gate electrodes are produced and are physically separated and electrically isolated from each other.

20. A method for producing an image sensor including an array of pixels that includes vertical charge-coupled device (VCCD) shift registers, can include forming a first layer of gate electrodes over the VCCD shift registers; forming a physical gap in the first layer of gate electrodes such that first and second sections of gate electrodes are produced and are physically separated and electrically isolated from each other; forming a second layer of gate electrodes over the first and second sections of gate electrodes in the first layer; and forming another physical gap in the second layer of gate electrodes such that first and second sections of gate electrodes are produced and are physically separated and electrically isolated from each other.

21. The method in preceding clause 20 can further include forming a subsequent layer of gate electrodes over a previous layer of gate electrodes and forming another physical gap in the subsequent layer of gate electrodes such that first and second sections of gate electrodes are produced and are physically separated and electrically isolated from each other.

Parts List
100 image sensor
102 vertical charge-coupled device shift register
104 shift register element
106 charge
108 shift register element
110 horizontal charge-coupled device shift register
112 output circuit
200 array of pixels
202 output structure
204 output structure
206 output structure
208 output structure
300 horizontal charge-coupled device shift register
302 extended horizontal charge-coupled device shift register
304 pixel array
400 horizontal charge-coupled device shift register
500 left side of pixel array
502 left side fast dump row gate
504 right side of pixel array
506 right side fast dump row gate
600 image capture device 602 light
604 imaging stage
606 image sensor
608 timing generator
610 processor
612 memory
614 display
616 other input/output
700 pixel array
702 gate electrode
704 gate electrode
706 gate electrode
708 gate electrode
710 gate electrode
712 gate electrode
714 gate electrode
716 gate electrode
718 section
720 section
722 line representing location of physical gap
724 vertical charge-coupled device shift register
726 photosensitive area
728 barrier implant
730 group
732 group
734 group
736 group
738 region
800 horizontal charge-coupled device shift register
802 pixel
804 barrier implant
900 physical gap
1200 output channel
1202 output channel
1204 horizontal charge-coupled device shift register
1206 horizontal charge-coupled device shift register
1208 output circuit
1210 output circuit
1300 output channel
1302 output channel
1304 horizontal charge-coupled device shift register
1306 horizontal charge-coupled device shift register
1308 output circuit
1310 output circuit
P1 timing pattern
P2 timing pattern
P3 timing pattern
P4 timing pattern
VA independent set of VCCD clocking signals
VB independent set of VCCD clocking signals
VC independent set of VCCD clocking signals
VD independent set of VCCD clocking signals

The invention claimed is:

1. A method for producing an image sensor comprising an array of pixels that includes vertical charge-coupled device (VCCD) shift registers that extend along a direction of charge transfer, the method comprising:
    forming gate electrodes over the VCCD shift registers extending in a direction transverse to the direction of charge transfer; and
    forming a physical gap in the gate electrodes physically separating and electrically isolating a first section of gate electrodes and a second section of gate electrodes, the physical gap extending along the direction of charge transfer.

2. The method as in claim 1, wherein the gate electrodes are substantially perpendicular to the direction of charge transfer.

3. The method as in claim 1, wherein the physical gap in the gate electrodes is substantially parallel to the VCCD shift registers.

4. The method as in claim 3, wherein the physical gap extends across the entire array of pixels.

5. The method of claim 1, wherein each of the first and second sections of gate electrodes is disposed within a different portion of the image sensor.

6. A method for producing an image sensor comprising an array of pixels that includes vertical charge-coupled device (VCCD) shift registers, the method comprising:
    forming gate electrodes over the VCCD shift registers; and
    forming a physical gap in the gate electrodes physically separating and electrically isolating a first section of gate electrodes and a second section of gate electrodes, the physical gap extending vertically along the array between the first section of gate electrodes and the second section of gate electrodes.

7. The method as in claim 6, wherein each VCCD shift register extends in a first direction and the gate electrodes extend in a second direction substantially perpendicular to the first direction.

8. The method as in claim 6, wherein each VCCD shift register extends in a first direction and the physical gap also extends in the first direction.

9. The method as in claim 6, wherein the physical gap extends across the entire array of pixels.

10. The method of claim 6, wherein each of the first and second sections of gate electrodes is disposed within a different portion of the image sensor.

* * * * *